US012591005B2

(12) United States Patent
Haba et al.

(10) Patent No.: US 12,591,005 B2
(45) Date of Patent: Mar. 31, 2026

(54) TESTING ELEMENTS FOR BONDED STRUCTURES

(71) Applicant: ADEIA SEMICONDUCTOR BONDING TECHNOLOGIES INC., San Jose, CA (US)

(72) Inventors: Belgacem Haba, Saratoga, CA (US); Christopher Aubuchon, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 256 days.

(21) Appl. No.: 18/321,314

(22) Filed: May 22, 2023

(65) Prior Publication Data

US 2023/0375613 A1     Nov. 23, 2023

Related U.S. Application Data

(60) Provisional application No. 63/344,772, filed on May 23, 2022.

(51) Int. Cl.
*G01R 31/28* (2006.01)
(52) U.S. Cl.
CPC ................................ *G01R 31/2884* (2013.01)
(58) Field of Classification Search
CPC ............ G01R 31/2884; G01R 31/2863; G01R 31/2896
USPC .................................... 324/762.01, 537, 500
See application file for complete search history.

(56) References Cited

U.S. PATENT DOCUMENTS

| | | | |
|---|---|---|---|
| 5,753,536 A | 5/1998 | Sugiyama et al. | |
| 5,771,555 A | 6/1998 | Eda et al. | |
| 6,080,640 A | 6/2000 | Gardner et al. | |
| 6,423,640 B1 | 7/2002 | Lee et al. | |
| 6,465,892 B1 | 10/2002 | Suga | |
| 6,675,469 B1 | 1/2004 | Haba et al. | |
| 6,887,769 B2 | 5/2005 | Kellar et al. | |
| 6,908,027 B2 | 6/2005 | Tolchinsky et al. | |

(Continued)

FOREIGN PATENT DOCUMENTS

| | | |
|---|---|---|
| CN | 111477612 A | 7/2020 |
| CN | 211929489 U | 11/2020 |

(Continued)

OTHER PUBLICATIONS

International Search Report and Written Opinion mailed Sep. 13, 2023, International Application No. PCT/US2023/023067, 13 pages.

(Continued)

*Primary Examiner* — Giovanni Astacio-Oquendo
(74) *Attorney, Agent, or Firm* — Knobbe, Martens, Olson & Bear LLP

(57) ABSTRACT

A bonded structure for testing a semiconductor device and a method for testing semiconductor devices is disclosed. The bonded structure may comprise a testing element and one or more semiconductor element. The testing element may comprise a testing circuitry. The testing element may be bonded to a semiconductor device or embedded within a semiconductor device. The testing element may be configured to test the semiconductor device. The testing element may be configured to test a first semiconductor device to which it is bonded as well as other semiconductor devices bonded to the first semiconductor device.

25 Claims, 7 Drawing Sheets

(56)                    References Cited

U.S. PATENT DOCUMENTS

| | | | |
|---|---|---|---|
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,660,776 B1 * | 2/2010 | Kious | G06N 5/025 |
| | | | 706/45 |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,566,612 B2 | 10/2013 | Davis et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,637,233 B2 * | 4/2020 | Hao | H02H 1/0092 |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,296,053 B2 | 4/2022 | Uzoh et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,462,419 B2 | 10/2022 | Haba | |
| 11,476,213 B2 | 10/2022 | Haba et al. | |
| 11,500,010 B2 * | 11/2022 | Rowling | G01R 31/2621 |
| 11,515,291 B2 | 11/2022 | DeLaCruz et al. | |
| 11,610,846 B2 | 3/2023 | Haba et al. | |
| 11,728,287 B2 | 8/2023 | DeLaCruz et al. | |
| 11,848,284 B2 | 12/2023 | DeLaCruz et al. | |
| 2003/0221152 A1 * | 11/2003 | Volkerink | G01R 31/318505 |
| | | | 714/736 |
| 2004/0084414 A1 | 5/2004 | Sakai et al. | |
| 2004/0175850 A1 | 9/2004 | Shimizu et al. | |
| 2006/0057945 A1 | 3/2006 | Hsu et al. | |
| 2007/0111386 A1 | 5/2007 | Kim et al. | |
| 2008/0088996 A1 | 4/2008 | Bonvalot et al. | |
| 2014/0175655 A1 | 6/2014 | Chen et al. | |
| 2014/0264739 A1 | 9/2014 | Morrow et al. | |
| 2015/0046612 A1 | 2/2015 | Gupta | |
| 2015/0064498 A1 | 3/2015 | Tong | |
| 2016/0343682 A1 | 11/2016 | Kawasaki | |
| 2017/0047260 A1 | 2/2017 | Huang et al. | |
| 2018/0106851 A1 * | 4/2018 | Schweitzer, III | H02H 7/261 |
| 2018/0151247 A1 | 5/2018 | Sato | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |
| 2019/0170814 A1 * | 6/2019 | Yun | G01R 31/2862 |

(56) References Cited

U.S. PATENT DOCUMENTS

| | | |
|---|---|---|
| 2019/0179785 A1 | 6/2019 | Keeth et al. |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0091115 A1 | 3/2020 | Wu et al. |
| 2020/0133902 A1 | 4/2020 | Tang et al. |
| 2020/0294908 A1 | 9/2020 | Haba et al. |
| 2020/0328162 A1 | 10/2020 | Haba et al. |
| 2020/0395321 A1 | 12/2020 | Katkar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0265313 A1 | 8/2021 | Chen et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0102224 A1 | 3/2022 | An et al. |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0237138 A1 | 7/2022 | Lanka et al. |
| 2022/0246497 A1 | 8/2022 | Fountain, Jr. et al. |
| 2022/0285303 A1 | 9/2022 | Mirkarimi et al. |
| 2022/0318111 A1 | 10/2022 | Choudhary et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |
| 2025/0273517 A1 | 8/2025 | Lee et al. |

FOREIGN PATENT DOCUMENTS

| | | |
|---|---|---|
| JP | 2013-033786 A | 2/2013 |
| JP | 2018-160519 | 10/2018 |
| KR | 10-2020-0002557 | 1/2020 |
| WO | WO 2005/043584 A2 | 5/2005 |
| WO | WO 2021/198009 A1 | 10/2021 |

OTHER PUBLICATIONS

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on $SiO_2$—$SiO_2$ bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

ONSEMI AR0820 image, cross section of a CMOS image sensor product. The part in the image was shipped on Sep. 16, 2021. Applicant makes no representation that the part in the image is

(56)        References Cited

OTHER PUBLICATIONS identical to the part identified in the separately submitted reference Bush, Nov. 8, 2018, Electronics Weekly.com ("Bush article"); however, the imaged part and the part shown in the Bush article share the part number "ONSEMI AR0820.".

Plobi, A. et al., "Wafer direct bonding: tailoring adhesion between brittle materials," Materials Science and Engineering Review Journal, 1999, R25, 88 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".

Campbell, Richard, "What Is Built-In Self Test And Why Do We Need It?," Evaluation Engineering, Mar. 1, 1996, 20 pages.

"Companies Review Costs to Update Working Capital Plans amid COVID-19 Crisis," Chiplets Market, Chiplets Market (Application: Microprocessors [MPUs], System-on-Chip [SOC] Device, Graphic Processing Units [GPUs], Programmable Logic Devices [PLDs], and Others; and End-use Industry; Automotive Electronics, Consumer Electronics, Industrial Automation, Healthcare, Military, IT & Telecommunication, and Others)—Global Industry Analysis, Size, Share, Growth, Trends, and Forecast, 2021-2031, Transparency Market Research, https://www.transparencymarketresearch.com/chiplets-market.html, printed Aug. 14, 2023, 7 pages.

Feige, C. et al., "Logic BIST technology evaluation: an industrial case study," European Test Workshop-Informal Digest, 2001, pp. 333-340.

Nan, Li et al., "Logic BIST: State-of-the-Art and Open Problems," arXiv preprint arXiv: 1503.04628, 2015, 6 pages.

Vranken, Harald et al., "Impact of test point insertion on silicon area and timing during layout," Proceedings of the conference on Design, automation and test in Europe, Feb. 2004, vol. 2, ** pages.

AEHR Test Systems, "FOX™ WaferPak Contactor—Single Touchdown Full-Wafer Test & Burn-in", Publication 4083047601RevC, (2028) downloaded from https://www.aehr.com/wp-content/uploads/2023/09/FOX-WaferPak-3.2.18.pdf in 1 page.

Formfactor® Case Study "Radar IC Manufacturer Cuts Testing Time in Half, Regardless of Elevated Temperatures, Using InfinityQuad Probes," Danube Integrated Circuit Engineering (DICE); (2022) in 4 pages.

Kim B.H. et al., "A Robust MEMS Probe Card with Vertical Guide for a Fine Pitch Test," J. Micromech. Microeng. Jun. 11, 2007;17(7): 1350-1359.

Rayming Technologies., "Top Aviation Engineering Services Companies in the World and What they Offer," downloaded from https://www.raypcb.com/aviation-engineering-services/; (2023) in 10 pages.

* cited by examiner

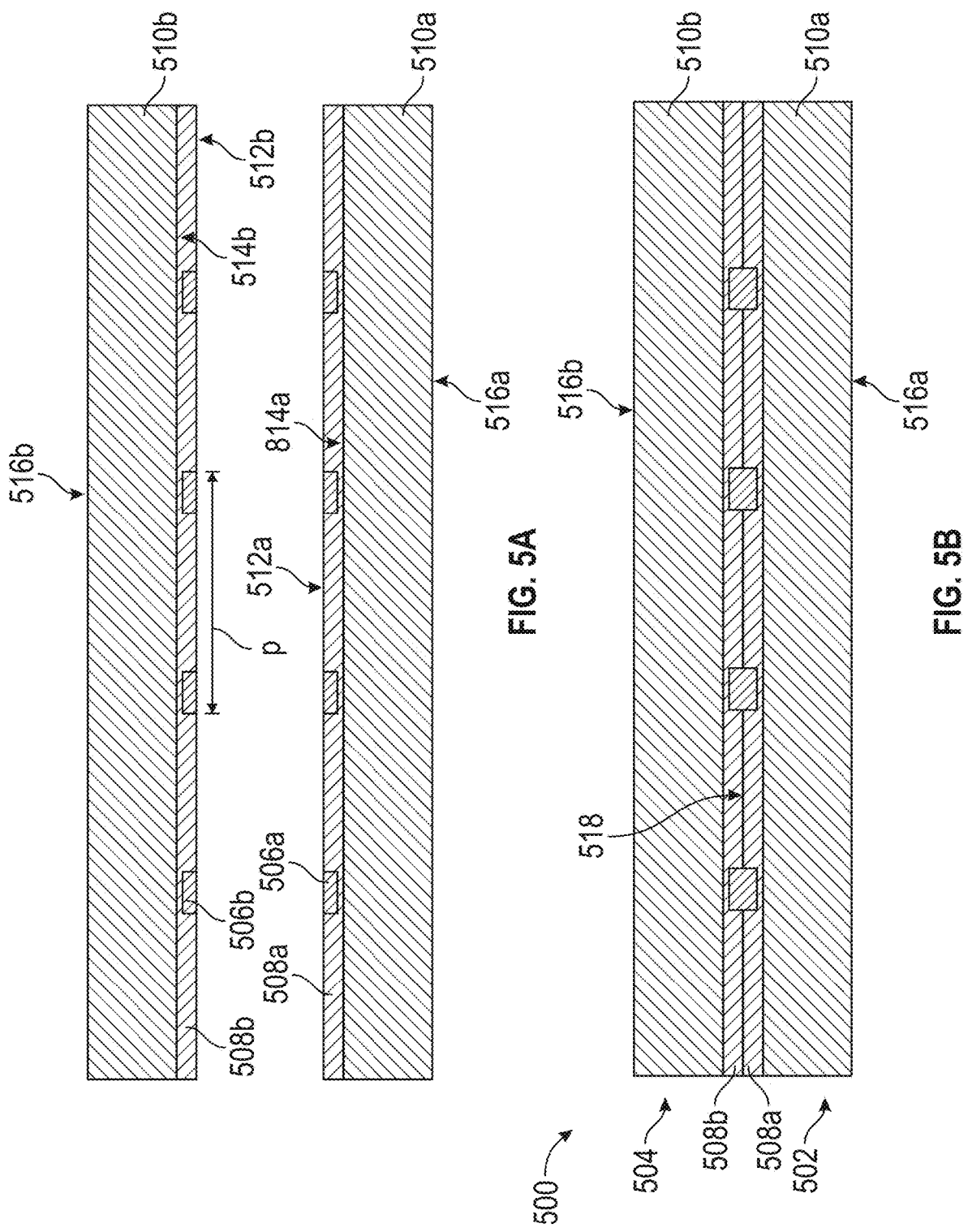

TESTING ELEMENTS FOR BONDED STRUCTURES

RELATED APPLICATIONS

This application claims the priority benefit of U.S. Provisional Patent Application 63/344,772 filed on May 23, 2022, entitled "TESTING ELEMENTS FOR BONDED STRUCTURES," which is incorporated by reference herein in its entirety.

BACKGROUND

Field

The field relates to self testing devices for bonded structures, in particular, to self testing elements that include self testing circuitry.

Description of the Related Art

Semiconductor devices, in particular system on a chip (SoC) devices, have increased in complexity while also decreased in size and dimension. As SoC devices and semiconductor devices become more complex, the importance of testing the functionality of these devices has increased. However, it can be challenging to provide testing circuitry that adequately tests important active circuits of the chip without contributing to an increased footprint of the chip. Accordingly, there remains a continuing demand for improved self-testing devices and processes.

SUMMARY

In one aspect a bonded structure is described. The bonded structure may include a first semiconductor element comprising a first active circuitry; and a testing element comprising a testing circuitry, the testing element directly bonded to the first semiconductor element without an adhesive along a bonding interface; wherein the testing circuitry is configured to test functionality of at least a portion of the first active circuitry of the first semiconductor element.

In some embodiments, the testing element further includes a memory configured to store a result of the test. In some embodiments, the testing element is smaller than the first semiconductor element. In some embodiments, a first nonconductive bonding layer of the first semiconductor element is directly bonded to a second nonconductive bonding layer of the testing element without an intervening adhesive; and wherein a first contact feature of the first semiconductor element is directly bonded to a second contact feature of the testing element without an intervening adhesive. In some embodiments, the testing element further includes a plurality of signal contact pads. In some embodiments, a majority of the plurality of signal contact pads are configured to test at least a portion of the first active circuitry of the first semiconductor element.

In another aspect a bonded structure is described. The bonded structure may include a first semiconductor element comprising a testing circuitry; a second semiconductor element directly bonded to the first semiconductor element without an adhesive along a bonding interface, the second semiconductor element comprising a first active circuitry; and wherein the testing circuitry is configured to test functionality of at least a portion of the first active circuitry of the second semiconductor element.

In some embodiments, the testing circuitry is further configured to store a result of the functionality of at least a portion of the first active circuitry. In some embodiments, a first nonconductive bonding layer of the first semiconductor element is directly bonded to a second nonconductive layer of the second semiconductor element without an intervening adhesive; and wherein a first contact feature of the first semiconductor element is directly bonded to a second contact feature of the second semiconductor element without an intervening adhesive. In some embodiments, the bonded structure further includes a third semiconductor element comprising a second active circuitry, the third semiconductor element directly bonded to the second semiconductor element, the testing circuitry configured to test functionality of at least a portion of the second active circuitry. In some embodiments, the bonded structure further includes a fourth semiconductor element comprising a third active circuitry, the fourth semiconductor element directly bonded to the third semiconductor element.

In some embodiments, the first semiconductor element further includes a fourth active circuitry. In some embodiments, the testing circuitry of the first semiconductor element is configured to test at least a portion of the functionality of the first active circuitry, the second active circuitry, the third active circuitry, and/or the fourth active circuitry. In some embodiments, the bonded structure further includes a third semiconductor element comprising a second active circuitry, the third semiconductor element directly bonded to the first semiconductor element; and wherein the testing circuitry is configured to test functionality of at least a portion of the second active circuitry. In some embodiments, the first semiconductor element includes a testing chip. In some embodiments, the testing chip is configured to only test the active circuitry of one or more other semiconductor elements and is devoid of other active circuitry. In some embodiments, the bonded structure further includes a third semiconductor element comprising a second active circuitry and a second bonding layer bonded to the second semiconductor element without an adhesive; and wherein the testing circuitry is configured to test functionality of at least a portion of the third active circuitry.

In some embodiments, the bonded structure further includes a fourth semiconductor element comprising a third active circuitry and a third bonding layer bonded to the second semiconductor element without an adhesive; and wherein the testing circuitry is configured to test functionality of at least a portion of the third active circuitry. In some embodiments, the test circuitry is configured to transmit one or more signals to the first active circuitry. In some embodiments, the one or more signals probe one or more portions of the first active circuitry. In some embodiments, the first active circuitry emits a return signal and the return signal is conveyed from the first active circuitry to the testing circuitry; and the testing circuitry is configured to analyze the return signal and transmit an indication signal to a first device.

In another aspect a bonded structure is described. The bonded structure may include a wafer, which may be referred to as a base wafer, comprising a first active circuitry and a self-testing core; and a first semiconductor element comprising a second active circuitry, the semiconductor element directly bonded to the base wafer without an adhesive, wherein the self testing core includes testing circuitry configured to test a functionality of at least a portion of at least one of the first active circuitry and the second active circuitry.

In some embodiments, a first nonconductive bonding layer of the base wafer is directly bonded to a second nonconductive layer of the first semiconductor element without an intervening adhesive; and wherein a first contact feature of the base wafer is directly bonded to a second contact feature of the first semiconductor element without an intervening adhesive. In some embodiments, the bonded structure further includes a third semiconductor element comprising a third active circuitry, a third nonconductive bonding layer, and a third contact feature in communication with the third active circuitry; wherein the third nonconductive bonding layer is directly bonded to a first nonconductive bonding layer of the base wafer without an intervening adhesive; and the third contact feature is directly bonded to the first contact feature of the base wafer without an adhesive. In some embodiments the first semiconductor element includes a fourth nonconductive bonding layer, and a fourth contact feature in communication with the second active circuitry.

In some embodiments, the bonded structure further includes a second semiconductor element comprising a third active circuitry, a third nonconductive bonding layer, and a third contact feature in communication with the third active circuitry; and wherein the third nonconductive bonding layer of the second semiconductor element and the fourth nonconductive bonding layer of the first semiconductor element are directly bonded without an intervening adhesive; and the third contact feature of the second semiconductor element is directly bonded to the fourth contact feature of the first semiconductor element without an intervening adhesive.

In some embodiments the second semiconductor element further includes a fifth nonconductive bonding layer, and a fifth contact feature in communication with the third active circuitry. In some embodiments, the bonded structure further includes a third semiconductor element comprising a fourth active circuitry, a sixth nonconductive bonding layer, and a sixth contact feature in communication with the third active circuitry; wherein the sixth nonconductive bonding layer of the third semiconductor element and the fifth nonconductive bonding layer of the second semiconductor element are directly bonded without an intervening adhesive; and the sixth contact feature of the third semiconductor element is directly bonded to the fifth contact feature of the second semiconductor element without an intervening adhesive. In some embodiments, the testing circuitry configured to test a functionality of at least a portion of at least one of the first active circuitry, second active circuitry, the third active circuitry, and the fourth active circuitry.

In another aspect, a method for forming a bonded structure is described, the method comprising: providing a first semiconductor element comprising a testing circuitry; bonding, without an adhesive, the first semiconductor element to a second semiconductor element; wherein the second semiconductor element includes a first active circuitry and the testing circuitry is configured to test a functionality of the first active circuitry.

In some embodiments, the method further includes bonding, without an adhesive, a third semiconductor element comprising a second active circuitry to the first semiconductor element. In some embodiments, the method further includes bonding a third semiconductor element comprising a second active circuitry to the second semiconductor element. In some embodiments, the method further includes the method further comprising bonding a fourth semiconductor element comprising a third active circuitry to the second semiconductor element. In some embodiments, the first semiconductor element includes a testing chip.

In some embodiments, the method further includes bonding at least one semiconductor element comprising an active circuitry to the second semiconductor element; and wherein the testing circuitry is configured to test at least a part of a functionality of the at least one semiconductor element.

In another embodiment, a bonded structure can include: a first semiconductor element comprising a first active circuitry; a first nonconductive bonding layer of the first semiconductor element at least partially defining a direct bonding surface of the bonded structure; and one or more traces connected to the first active circuitry and extending at least partially into the first nonconductive bonding layer, wherein the one or more traces is configured to provide electrical communication between the first active circuitry and a testing element, the one or more traces terminating at or below the direct bonding surface.

In some embodiments, the bonded structure can include a first contact feature at least partially embedded within the first nonconductive bonding layer and connected to the one or more traces, the first contact feature configured to directly bond to a corresponding second contact feature of the testing element. In some embodiments, the bonded structure can include a plurality of contact features at least partially embedded in the first nonconductive bonding layer, wherein the first nonconductive layer and the plurality of contact features cooperate to at least partially define a bonding surface for direct hybrid bonding. In some embodiments, the one or more traces terminate at or below a bonding surface of the bond structure, the one or more traces not connected to a contact pad at the bonding surface of the bonded structure For purposes of summarizing the disclosure and the advantages achieved over the prior art, certain objects and advantages of the disclosure are described herein. Not all such objects or advantages may be achieved in any particular embodiment. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIGS. 5A-5B schematically illustrate a process for forming a directly hybrid bonded structure without an intervening adhesive according to some embodiments.

DETAILED DESCRIPTION

Overview

Figures 1A, 1B:
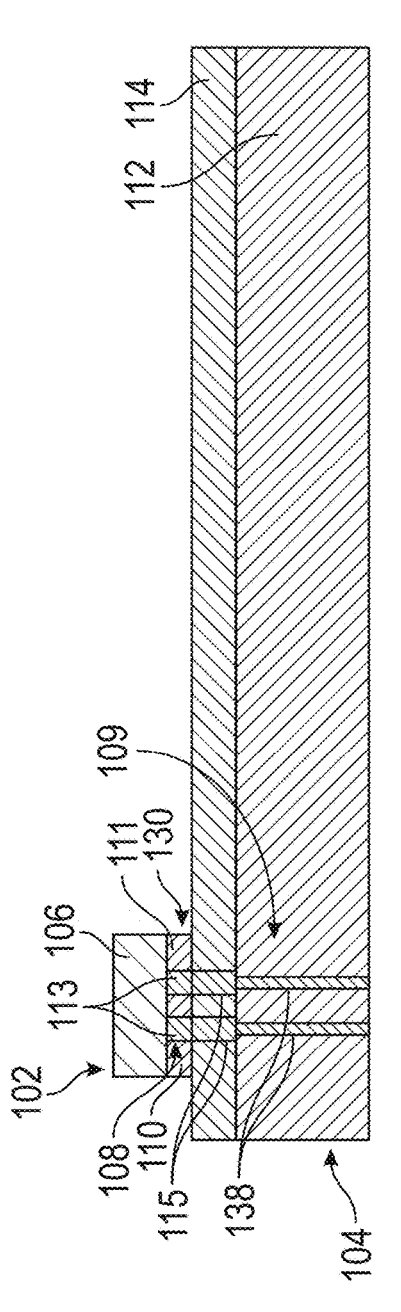
FIG. 1A is a schematic side sectional view of a self testing chip directly bonded to a semiconductor element, according to one embodiment.
FIG. 1B is a schematic side sectional view of a self testing chip directly bonded to a semiconductor element, according to another embodiment.

The present disclosure may be understood by reference to the following detailed description. It is noted that, for purposes of illustrative clarity, certain elements in various drawings may not be drawn to scale, may be represented schematically or conceptually, or otherwise may not correspond exactly to certain physical configurations of embodiments.

Embodiments relate to testing elements for semiconductor devices, e.g., system on a chip (SoC). The testing elements, or self testing cores (ST cores), of this disclosure may reduce the area of a semiconductor device that is used to perform self-testing functions. This may be attributed to the self testing cores being bonded to a suitable bonding surface of the semiconductor device, as opposed to being patterned on areas of the chip to be tested. As explained herein, the ST cores can be provided in a separate chip or chiplet that is directly bonded to a base element, which can include a chip (or wafer) to be tested or a host device to which the chip(s) to be tested are bonded.

Conventionally, self testing devices (e.g., self testing circuits) are widely used to evaluate and self test semiconductor devices using as few probe contacts as possible. As semiconductor devices (e.g., chips or integrated circuit devices) become more complicated, self testing architectures have become more important as they allow for higher yield in more complex devices. In particular, SoC devices, which are difficult to test with external measurement devices, benefit from built in self test structures and circuits.

One method for performing functionality tests is the built in self test method (BIST). Conventional BIST methods dedicate a portion of a chip's area to self testing circuits. More complex semiconductor devices also utilize more complex self testing circuits. However, complex self-testing circuits occupy more space on a chip, limiting the ability to miniaturize complex semiconductor devices.

In some devices, self testing circuits are added within dicing lanes. However, self testing circuits have become larger and more complex which impedes efforts to miniaturize devices. Therefore, there is a need for self testing circuits with high functionality (e.g., self-testing circuitry that tests a large portion of a semiconductor device's functionality), without occupying large areas of the semiconductor device, e.g. within the die.

Various embodiments disclosed herein can utilize a self testing core which includes a testing circuitry. In some embodiments, the self testing core can include a chip and can be bonded to the surface of a semiconductor element. The self testing core can be configured to test some or all of a semiconductor device's functionality. In some embodiments, the self testing core can be bonded to a first semiconductor element which is bonded to further semiconductor elements. In some embodiments, the self testing core can be configured to test some or all of the functionality of the further bonded semiconductor elements.

In some embodiments the self testing core can be embedded within a base element. In some embodiments, the embedded self testing core can be configured to test some or all of the functionality of the base element. In some embodiments, the base element can be bonded to further semiconductor devices. In some embodiments, the self testing core can be configured to test some or all of the functionality of some or all of the semiconductor elements that are bonded to the base element. In some embodiments, the base element is a chip, a wafer, or an interposer.

Another advantage of using a self testing core or a self testing chip according to the disclosed embodiments is the availability of using a low-cost processing node to pattern the test circuitry (e.g., a 40-nm processing node) while a higher resolution processing node (e.g., a 2 nm processing node) can be used to pattern the active circuitry of the semiconductor elements. This change in patterning can lead to lower reduced costs associated with the test circuitry, such that the testing element (e.g., a testing chiplet) can be patterned with lower cost technology and the semiconductor die with more advanced active circuitry can be patterned with the higher resolution and more expensive technology. The use of direct bonding to bond the testing element to the semiconductor die allows for the decoupling of the testing element (e.g., testing chiplet) and the semiconductor element (e.g., active die) so that the elements can be manufactured using different processing nodes and techniques. Using direct bonding can also enable this cost-effective node strategy, through, for example, enabling fine pitch contacts which provides a high number of input/output ("I/O") pins for testing the chip circuitry. Fine pitch contacts can allow for high density testing that can be achieved through direct bonding.

The testing element or self testing core (e.g., a chip or chiplet) can be directly bonded (e.g., using hybrid direct bonding techniques, such as the DBI® techniques used by Adeia of San Jose, California) to bonding surfaces of a semiconductor element (such as a semiconductor chip) that can benefit from self testing. After the self testing core is bonded the element (e.g., a semiconductor chip or integrated device die), the self testing core can test some or all of the functionality of the element.

Example Embodiments of Testing Elements for Bonded Structures

FIG. 1A is a schematic side sectional view of a testing chip 102 (e.g., a testing core or self testing core) bonded to a semiconductor element 104. In some embodiments, the testing chip 102 can include a core substrate 106, test circuitry 108 patterned in a portion of the substrate 106, and a chip bonding layer (e.g., a bonding layer 110). Testing chip 102 can test the active circuitry of one or more other semiconductor elements and can itself be devoid of any other active circuitry. In various embodiments, at least 80% or at least 90% of all circuitry in the testing chip 102 comprises test circuitry 108. In some embodiments, all of the circuitry provided in the testing chip 102 comprises test circuitry 108. The test circuitry 108 can include one or both of a logic circuitry and/or a memory circuitry.

The bonding layer 110 can include a dielectric layer 111 and a plurality of conductive contacts 113 at least partially embedded in the dielectric layer 111. Although FIG. 1A schematically illustrates chip bonding layer 110 as a single layer, it should be appreciated that layer 110 can include multiple layers or sub-layers. In various embodiments, the bonding layer 110 can comprise one or multiple back-end-of-line BEOL layers provided over the core substrate 106. In some embodiments, the semiconductor element 104 can include a device containing active circuitry 109 (shown schematically in FIG. 1A as a portion of the substrate in which active circuitry 109 can be patterned) (e.g., circuitry including at least one integrated circuit with one or more transistors) patterned in a portion of a substrate 112 and/or a substrate bonding surface (e.g., a bonding layer which can be a dielectric layer 114) having a plurality of conductive contacts 115 at least partially embedded in the dielectric layer 114. In some embodiments, the substrate 112 of semiconductor device 104 can include a system on a chip (SoC) device. In some embodiments, the semiconductor element 104 can include a central processing unit, a memory device, a microcontroller, a microprocessor, an application specific integrated circuit, a graphics processing unit, or any combination thereof. The substrate 112 of semiconductor device 104 can include a semiconductor device portion including a semiconductor material such as silicon. For example, the substrate 112 can include single crystal silicon or multicrystalline silicon. In some embodiments, the semiconductor element 104 can include through vias 138. The through vias 138 can include a metal structure that extends at least partially through and/or completely through the semiconductor element 104. In some embodiments, the through via 138 can include a conductive material such as copper or any other suitable conductive material. In some embodiments, the active circuitry 109 can be connected to a surface of the substrate 112 by an input and/or output structure. In some embodiments, the input and/or output structure can be a through via 138 for example. The input and/or output structure can be in electrical communication with the active circuitry 109. In some embodiments, the semiconductor element 104 can include a routing circuitry in communication with and/or connected to the active circuitry 109. In some embodiments, the input and/or output structure can include the routing circuitry. In some embodiments, the electrical contact contacts 115 can be electrically connected to and/or in communication with one and/or both of the active circuitry 109 and/or a routing circuitry.

Although FIG. 1A schematically illustrates substrate bonding layer 114 as a single layer, it should be appreciated that layer 114 can include multiple layers or sub-layers (including, e.g., BEOL layer(s) as described above). In some embodiments, the testing chip 102 can be directly hybrid bonded to the semiconductor element 104. In some embodiments, the chip bonding layer 110 is directly bonded to the substrate bonding surface 114. In a hybrid bonding configuration, non-conductive dielectric layers 114 and 110 can be directly bonded without an adhesive and opposing contacts 113 and 115 can also be directly bonded without an adhesive. In some embodiments, the dielectric layers 111 and 114 can include inorganic dielectric materials compatible with integrated circuit fabrication. For example, the dielectric layers 111 and 114 can be dielectric materials such as silicon nitride, silicon oxynitride, silicon carbonitride, diamond-like carbon, and/or any other suitable dielectric materials. In some embodiments, the conductive contacts 113 and 115 can include any suitable metal, such as copper.

In some embodiments, the testing chip 102 can test some and/or all of the functionality of active circuitry 109 of the semiconductor element 104. In some embodiments, the active circuitry 109 can include one or both of a logic and/or memory circuitry. For example, in operation, the testing circuitry 108 can transmit one or more signals to the active circuitry 109 (e.g., one or more transistors) through the directly bonded conductive contact pads 113 and 115 of the testing chip 102 and the semiconductor element 104. Additionally or alternatively, to test the semiconductor element 104, the testing chip 102 can communicate with active circuitry 109 in the semiconductor element 104 by way of lateral traces and/or vertical interconnects in the chip. The lateral traces can laterally route the one or more signals through the lateral traces from the active circuitry 109 to the contact pads 113 and 115. In some embodiments, the non-conductive layers may be one or more back end of line (BEOL) layers. In some embodiments, the nonconductive layer or dielectric layer 114 may be formed over the trace lines. The transmitted signal(s) can probe portions of the active circuitry (e.g., one or more transistors to be probed or tested), and the tested active circuitry can emit a return signal that is conveyed from the semiconductor element 104 to the testing circuitry 108 of the testing chip 102 by way of the contact pads 113 and 115 of the bonding layers. The return signal can be processed by the testing circuitry, which can be programmed to determine whether the tested active circuitry of the semiconductor element 104 is functional and/or non-functional. The return signal can also be saved by an internal memory of the testing chip 102. The testing chip 102 can transmit an indication signal to the semiconductor element 104 and/or to an external device (e.g., a package or system board) indicating the status of the tested active circuitry (e.g., whether the tested circuit(s) are functional and/or non-functional). The testing chip 102 can store the return signal which can be retrieved by a testing engineer or external testing system.

In some embodiments, the functionality of the semiconductor element 104 can be indicative of the suitability of semiconductor element 104 for a given purpose and/or of the quality of semiconductor element 104. In some embodiments, the quality of semiconductor element 104 corresponds to whether or not semiconductor element 104 functions as designed. In some embodiments, following the testing of the active circuitry 109, the testing chip 102 can remain bonded to the semiconductor element 104 and be placed into an electronic device. In other embodiments, the testing chip 102 can be debonded from the semiconductor element 104 before semiconductor element 104 is packaged and/or placed into the electronic device. For instance, the testing chip 102 may be polished off the semiconductor element 104, or otherwise removed from the semiconductor element 104. In embodiments in which the testing chip 102 is removed from the semiconductor element 104, one or more traces connecting to the active circuitry 109 may extend from the active circuitry 109 at least partially into the nonconductive layer 114. The one or more traces can terminate at location at the bonding surface or below the bonding surface of the element 104. In some embodiments, the traces can extend from the active circuitry 109 to one or more test contact features or pads (e.g., pads 115) that were bonded to the test chip 102 before debonding. After debonding, the one or more test contact features or pads can be exposed at the hybrid bonding surface and may not be directly bonded to another element. Other pads 115 of the element 104 can be directly bonded to corresponding pads of other elements (such as other active dies).

FIG. 1B is a schematic side section view of a testing chip 102 (e.g., a testing core or a self testing core) bonded to a semiconductor element 104. In some embodiments, the testing chip 102 can include a test circuitry 108 patterned in a portion of the substrate 106, and a chip bonding layer (e.g., a bonding layer 110).

The bonding layer 110 can include a dielectric layer 111 and a plurality of conductive contacts 113 at least partially embedded in the dielectric layer 111. Although FIG. 1B schematically illustrates chip bonding layer 110 as a single layer, it should be appreciated that layer 110 can include multiple layers or sub-layers. In some embodiments, the semiconductor element 104 can include a device containing active circuitry 109 (e.g., circuitry including at least one integrated circuit having at least one transistor) patterned in a portion of a substrate 112 and a substrate bonding surface (e.g., a bonding layer which can be a dielectric layer 114), having a plurality of conductive contacts 115 at least partially embedded in the dielectric layer 114. Although FIG. 1B schematically illustrates substrate bonding layer 114 as a single layer, it should be appreciated that layer 114 can include multiple layers or sub-layers. In some embodiments, the semiconductor element 104 can include a central processing unit, a memory device, a microcontroller, a microprocessor, an application specific integrated circuit, a graphics processing unit, or any combination thereof. The substrate 112 of semiconductor device 104 can include silicon. For example, the substrate 112 can include single crystal silicon or multicrystalline silicon.

Although FIG. 1A schematically illustrates substrate bonding layer 114 as a single layer, it should be appreciated that layer 114 may include multiple layers or sub-layers. In some embodiments, the testing chip 102 may be directly hybrid bonded to the semiconductor element 104. In some embodiments, the chip bonding layer 110 can be directly bonded to the substrate bonding surface 114. In a hybrid bonding configuration, non-conductive dielectric layers 114 and 111 may be directly bonded without an adhesive and opposing contacts 113 and 115 may also be directly bonded without an adhesive. In some embodiments, the dielectric layers 111 and 114 may include inorganic dielectric materials compatible with integrated circuit fabrication. For example, the dielectric layers 111 and 114 may be dielectric materials such as silicon nitride, silicon oxynitride, silicon carbonitride, diamond-like carbon, and/or any other suitable dielectric materials. In some embodiments, the conductive contacts 113 and 115 can include any suitable metal, such as copper.

In some embodiments, a second semiconductor element 116 may be bonded via second device bonding layer 118 to the substrate bonding surface 114 at a first position. The second semiconductor element 116 can include a second semiconductor device 120 containing active circuitry 123 (e.g., circuitry including at least one integrated circuit having one or more transistors and/or an SoC) patterned in and/or on a portion of an element 116 and a second element bonding surface (e.g., a bonding layer which may be a dielectric layer 118) having a plurality of conductive contacts 119 at least partially embedded in the dielectric layer 118. Although FIG. 1B schematically illustrates second bonding layer 118 as a single layer, it should be appreciated that layer 118 can include multiple layers or sub-layers. In some embodiments, second semiconductor element 116 may be directly hybrid bonded to the semiconductor element 104. In some embodiments, the second element bonding layer 118 may be directly bonded to the substrate bonding surface 114. In a hybrid bonding configuration, non-conductive dielectric layers 114 and 118 can be directly bonded without an adhesive and opposing contacts 119 and 115 can be directly bonded without an adhesive.

In some embodiments, a third semiconductor element 122 may be bonded via a third device bonding layer 124 to the substrate bonding surface 114 at a second position. The third semiconductor element 122 may include a third semiconductor device 126. Third semiconductor element 122 and second semiconductor element 116 can be mounted to the common semiconductor element 104. As shown, the third semiconductor element 122 and second semiconductor element 116 can be laterally spaced on semiconductor 104. In some embodiments, the third semiconductor element 122 can include a device containing active circuitry 125 (e.g., circuitry including at least one integrated circuit having one or more transistors and/or an SoC), which may include one or both of a logic and/or memory circuitry) patterned in a portion of an element 122 and a bonding surface (e.g., a bonding layer which may be a dielectric layer 124) having a plurality of conductive contacts 121 at least partially embedded in the dielectric layer 124. Although FIG. 1B schematically illustrates third device bonding layer 124 as a single layer, it should be appreciated that layer 124 can include multiple layers or sub-layers. In some embodiments, third semiconductor element 122 may be directly hybrid bonded to the semiconductor element 104. In some embodiments, the third element bonding layer 124 can be directly bonded to the substrate bonding surface 114. In a hybrid bonding configuration, non-conductive dielectric layers 114 and 124 can be directly bonded without an adhesive and opposing contacts 121 and 115 can be directly bonded without an adhesive.

In some embodiments, the semiconductor elements 104, 116, and/or 122 may include through vias 138. The through vias 138 may include a metal structure that extends at least partially through and/or completely through the semiconductor device. In some embodiments, the through via 138 can include a conductive material such as copper or any other suitable conductive material. In some embodiments, the semiconductor element 104 can include a routing circuitry in communication with and/or connected to the active circuitry 109. In some embodiments, the input and/or output structure can include the routing circuitry. In some embodiments, the electrical contacts 115 can be electrically connected to and/or in communication with one and/or both of the active circuitry 109 and/or a routing circuitry.

In some embodiments, testing chip 102 can test at least a portion and/or all of the functionality of semiconductor element 104, a portion and/or all of the functionality of second semiconductor element 116, and/or a portion of and/or all of the functionality of third semiconductor element 122. In some embodiments, testing chip 102 need not be directly bonded to second semiconductor element 116 and/or third semiconductor element 122 in order to test a portion of and/or all of the functionality of second semiconductor element 116 and/or third semiconductor element 122. In some embodiments, the functionality of the semiconductor elements 104, 116, and/or 122 can be indicative of the suitability of each semiconductor element for a given purpose and/or of the quality of each semiconductor element. In some embodiments, the quality of the semiconductor elements 104, 116, and/or 122 can correspond to whether or not semiconductor elements 104, 116, and/or 122 functions as designed.

In some embodiments, further semiconductor elements can be bonded to semiconductor element 104. Testing chip 102 can test some or all of the functionality of these further bonded semiconductor elements in a similar fashion as described above. In some embodiments, the testing chip 102 can test some or all of the functionality of any number of semiconductor devices, e.g., 1, 2, 3, 4, 5, 6, 7, or more semiconductor devices. In some embodiments, the testing chip 102 can test a plurality of semiconductor devices sequentially and/or simultaneously.

In some embodiments, testing chip 102 can include a plurality of contact pads. In some embodiments, the contact pads can include signal pads (e.g., pads to transmit signals) power pads (e.g., pads configured to be connected to a power supply and transmit power), and/or ground pads (e.g., pads that are designed to ground the electronic device). In some embodiments, the signal pads can conduct a testing signal from the testing chip 102 to a portion of semiconductor element 104 and/or a portion or all of the functionality of second semiconductor element 116 and/or a portion of or all of the functionality of third semiconductor element 122.

In some embodiments, testing chip 102 can include a plurality of signal pads. In some embodiments, a plurality of signal pads can be at the bond interface 130. In some embodiments, at least 50%, at least 60%, at least 70%, at least 80%, at least 90%, or at least 99%, or any value therebetween, of the signal pads can test a portion of semiconductor element 104 and/or a portion or all of the functionality of second semiconductor element 116 and/or a portion of or all of the functionality of third semiconductor element 122. In some embodiments, 90% of the signal pads can test a portion or all of the functionality of semiconductor element 112. In some embodiments, 50% of the signal pads can test a portion or all of the functionality of semiconductor element 112.

Figure 1C:
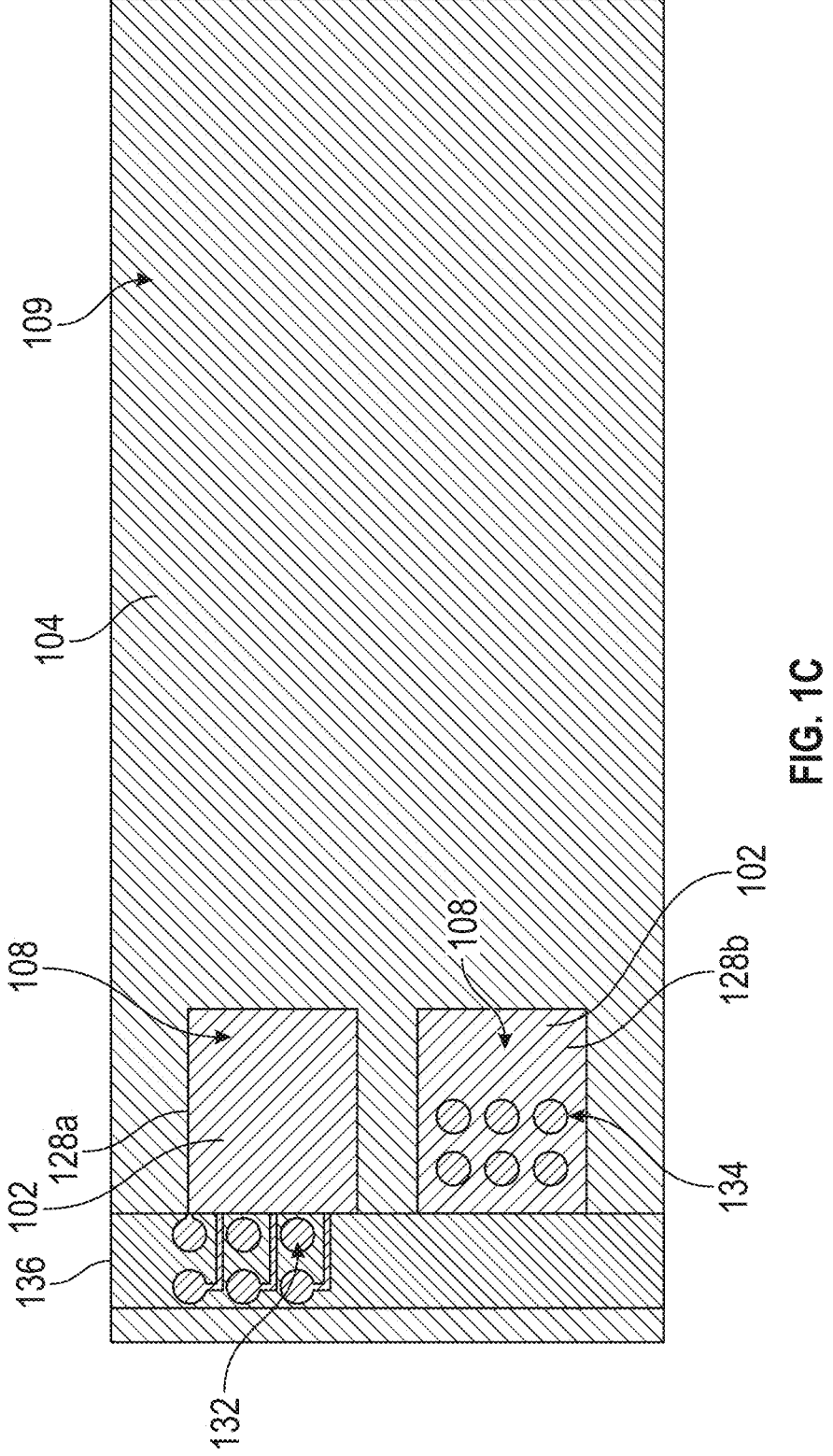
FIG. 1C is a schematic top view showing self testing chips bonded to a semiconductor element.

FIG. 1C is a schematic top view of testing chips 102 (e.g., a testing core or self-testing core) bonded to a semiconductor element 104 as described in FIGS. 1A-1B in wafer form. Testing core 128a can include test pads 132 and be positioned on the surface of semiconductor element 104. Testing core 128a and testing circuitry 108 can be in electrical communication with test pads 132. Test pads 132 can be in electrical communication with semiconductor element 104 and integrated circuitry 109. Test pads 132 can be placed in a dicing lane 136 which can then be removed by a dicing process.

Testing core 128b can include test pads 134 and be positioned on a rear side of testing core 128b. Test pads 134 can be in electrical communication with test circuitry 108. Test pads 134 can be in electrical communication with semiconductor element 104 and integrated circuitry 109. The test pads 132 and 134 can allow for a testing of the active circuitry 109 by an external probe. In some embodiments, test pads 132 and 134 can transmit signals from the testing circuitry 108 to an external device (e.g., a package or system board or outside operator) indicating the status of the tested active circuitry (e.g., whether the tested circuit(s) are functional and/or non-functional).

Figures 2A, 2B:
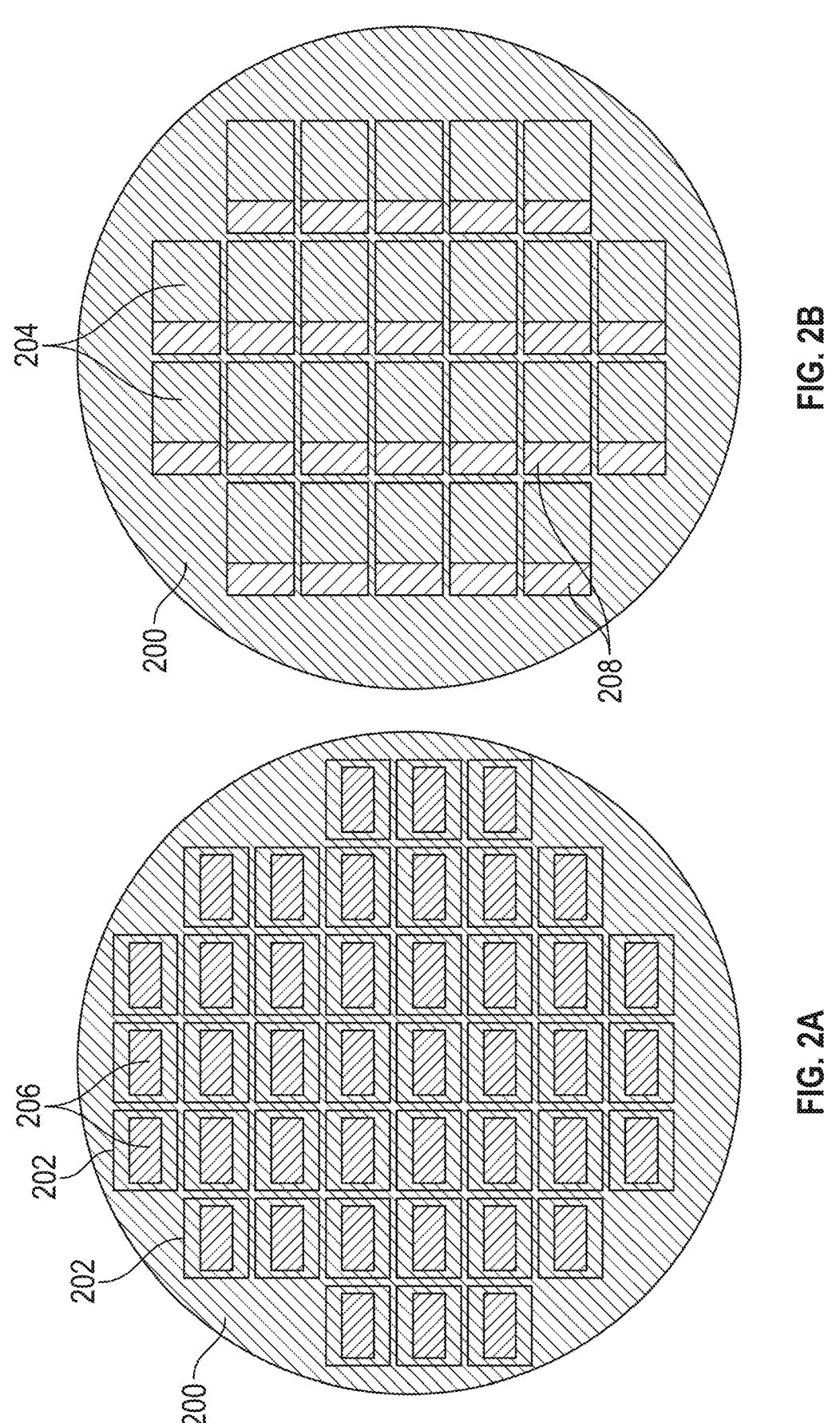
FIG. 2A is a schematic top view showing self testing chips bonded to semiconductor elements in wafer form.
FIG. 2B is a schematic top view showing semiconductor elements with conventional built in self test circuits integrated with chips in wafer form.

As shown in FIGS. 2A and 2B, the use of bonded self testing chips 206 can lead to an increase in device yield. FIG. 2A illustrates a top view of an un-diced wafer 200 with semiconductor devices 202 and bonded self testing cores, or chips, 206. In FIG. 2A, each semiconductor device 202 can be bonded to a bonded self testing core 206. By having bonded self testing core 206 bonded to each semiconductor device 208, the total number of semiconductor devices 202 that can be fabricated from un-diced wafer 200 is larger than if the testing circuitry were patterned in portions of the semiconductor device 202. In one example, such as in FIG. 2A, the number of semiconductor devices 204 fabricated from wafer 200 is forty-two (42).

FIG. 2B illustrates the lower number of semiconductor devices that can be fabricated on a wafer 200 with built in self testing circuitry according to conventional self-testing methods. In FIG. 2B, un-diced wafer 200 is the same size as in FIG. 2A. However, unlike in FIG. 2A, in FIG. 2B the self testing circuitry 208 is built into each semiconductor device 204. Built in test circuitries 208, which can extend the footprint of semiconductor device 204, can lead to significant reduction in the number of semiconductor devices 204 that can be produced from un-diced wafer 200. Because the built in self testing circuitry 208 are patterned into semiconductor devices 204, the footprint of semiconductor devices 204 (e.g., the overall size of the devices) increases. Increased device size can lower the number of semiconductor devices 204 that can be fabricated from wafer 200. However, in FIG. 2A, self testing circuitries are externalized on a directly bonded chip 206. Removing the testing circuitries from the device footprint 202 can allow for a smaller device footprint resulting in more devices per wafer 200. As noted above, the fine pitch contexts enabled by direct hybrid bonding techniques can allow for a high number of testing I/O pads to test complex active circuits on the semiconductor device 204.

As shown in FIG. 2A, self testing chips can be suitable for testing un-diced or diced wafers (e.g., device dies). In some embodiments, self testing chips can be suitable for die to wafer formats depending on cost, node, yield, and overall economics. In a die to wafer format, multiple diced self testing chips or dies can be bonded to a wafer containing semiconductor devices. In wafer-to-wafer formats, a wafer of testing chips can be directly bonded to a wafer of semiconductor devices and subsequently singulated together.

Figures 3A, 3B:
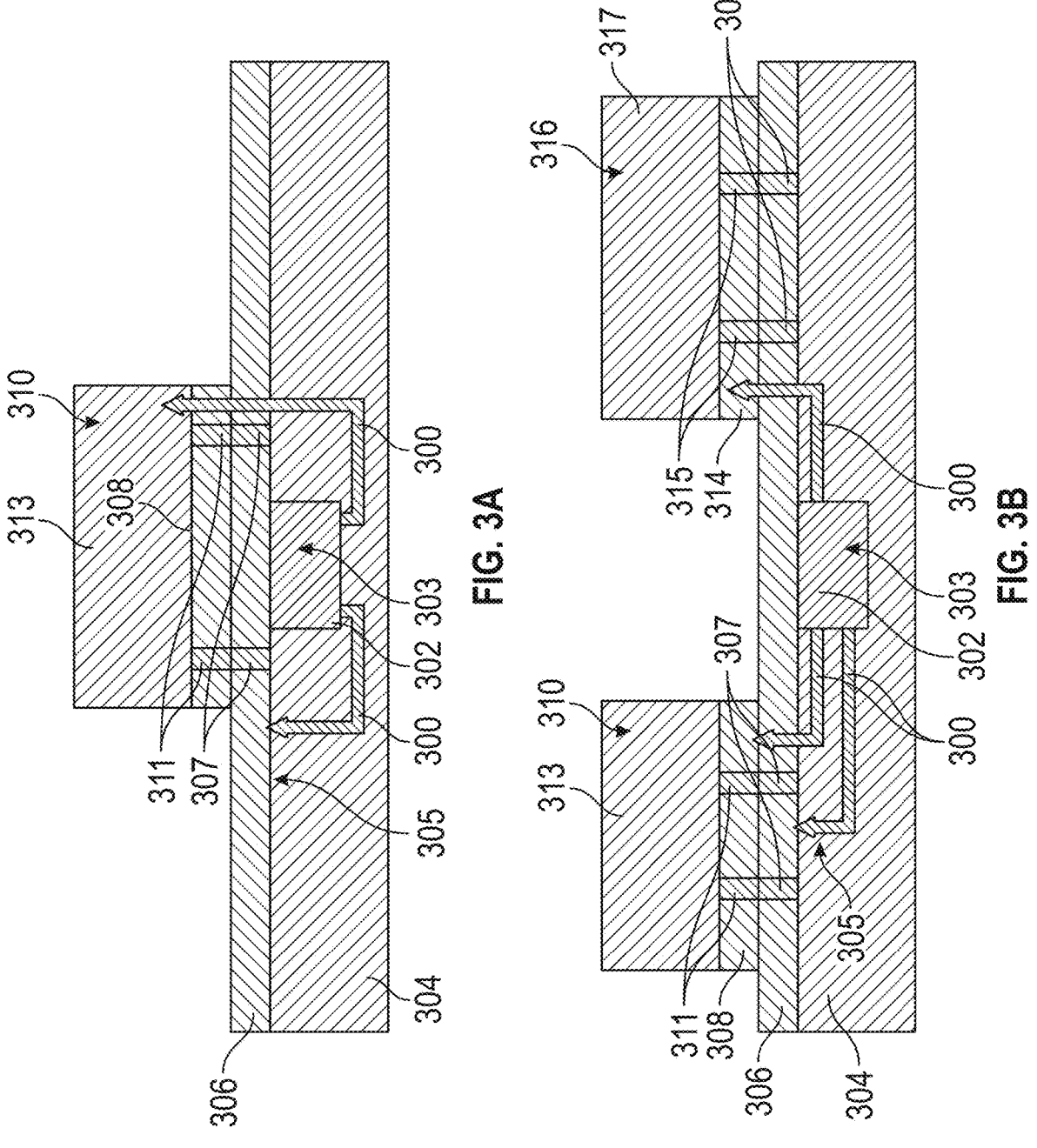
FIG. 3A is a schematic side sectional view of a self testing core embedded in a chip bonded to a semiconductor element.
FIG. 3B is a schematic side sectional view of a self testing core embedded in a chip bonded to a plurality of semiconductor elements spaced laterally apart from one another on the chip.

FIG. 3A is a schematic side sectional view of a self testing core 302 patterned in a base chip 304. In some embodiments, self testing core 302 can include a testing circuitry 303. In some embodiments, self testing core 302 can be patterned in the base chip 304. Base chip 304 can include a substrate bonding surface (e.g., a bonding layer which can be a dielectric layer 306) having a plurality of conductive contacts 307 at least partially embedded in the dielectric layer 306 and a device containing active circuitry 305 (e.g., circuitry including at least one integrated circuit) patterned in a portion of a base chip 304. Active circuitry 305 can include one or both of a memory circuitry and/or logic circuitry. Although FIG. 3A schematically illustrates base chip bonding layer 306 as a single layer, it should be appreciated that layer 306 can include multiple layers or sub-layers. In some embodiments, a second semiconductor device 313 can include a second device front side bonding layer 308 and an active circuitry 310 (e.g., circuitry including at least one integrated circuit) patterned in a portion of the second semiconductor device 313. The second device front side bonding layer 308 can be a dielectric layer 308 having a plurality of conductive contacts 311 at least partially embedded in the dielectric layer 308. Active circuitry 310 can include one or both of a logic circuitry and/or memory circuitry. Although FIG. 3A schematically illustrates second device front side bonding layer 308 as a single layer, it should be appreciated that layer 308 can include multiple layers or sub-layers. In some embodiments, the base chip bonding layer 306 can be directly bonded to the second device front side bonding layer 308. In a hybrid bonding configuration, non-conductive dielectric layer 306 and 308 can be directly bonded without an adhesive and opposing contacts 311 and 307 can be directly bonded without an adhesive.

In some embodiments, self testing core 302 can test some or all of the functionality of base chip 304 and/or the second semiconductor device's active circuitry 310. Testing paths 300 illustrate that self testing core 302 can be in electrical communication with base chip 304 and the second semiconductor element 313. For example, to test the base chip 304, the self testing core 302 can communicate with active circuitry 305 in the base chip 304 by way of lateral traces in the chip. Similarly, the testing circuitry 303 can transmit one or more signals to the active circuitry 310 (e.g., one or more transistors) of the second semiconductor element 313 through the directly bonded conductive contact pads 307 and 311 of the base chip 304 and the second semiconductor element 313. The transmitted signal(s) can probe portions of the active circuitry 310 of the second semiconductor element 313 (e.g., one or more transistors to be probed or tested), and the tested active circuitry 310 can emit a return signal that is conveyed from the second semiconductor element 313 to the testing circuitry 303 of the self testing core 302 by way of the contact pads 307 and 311 of the bonding layers 306 and 308. The return signal can be processed by the testing circuitry 303, which can be programmed to determine whether the tested active circuitry 310 of the second semiconductor element 313 is functional and/or non-functional. The return signal can also be stored by an internal memory of the self testing core 302. The self testing core 302 can transmit an indication signal to the base chip 304, the second semiconductor device 313, and/or to an external device (e.g., a package or system board) indicating the status of the tested active circuitry (e.g., whether the tested circuit(s) are functional and/or non-functional). A testing engineer or testing machine can access the return signal stored in the self testing core by probing contacts of the self testing core 302, for example. In some embodiments, self testing core 302 can test some or all of the functionality of any number of semiconductor devices, e.g., 1, 2, 3, 4, 5, 6, 7, or more semiconductor devices. In some embodiments, self testing core 302 can test a plurality of semiconductor devices sequentially and/or simultaneously.

FIG. 3B is a schematic side sectional view of a self testing core 302 patterned in a base chip 304. In some embodiments, self testing core 302 can include a testing circuitry 303. Like in FIG. 3A, a second semiconductor device 313 can have an active circuitry 310 that can be bonded to a base chip 304 in a first position. In some embodiments, a third semiconductor device 317 can include a third device front side bonding layer 314 and an active circuitry 316 (e.g., circuitry including at least one integrated circuit) patterned in a portion of the third semiconductor device 317. The third device front side bonding layer 314 can be a dielectric layer having a plurality of conductive contacts 315 at least partially embedded therein. The third semiconductor device 317 can be bonded to a second position on the base chip 304. In some embodiments, active circuitry 316 can include one or both of a logic and/or memory circuitry. In some embodiments, the base chip bonding layer 306 is directly bonded to the third device front side bonding layer 314. In a hybrid bonding configuration, non-conductive dielectric layers 306 and 314 can be directly bonded without an adhesive and opposing contacts 315 and 307 can also be directly bonded without an adhesive.

Although FIG. 3B schematically illustrates third device front side bonding layer 314 as a single layer, it should be appreciated that layer 314 can include multiple layers or sub-layers. In some embodiments, self testing core 302 can test some or all of the functionality of base chip 304, second semiconductor device 313, and/or third semiconductor device 317 in a similar fashion as described in FIG. 3A. Testing paths 300 illustrate that self testing core 302 can be in electrical communication with base chip 304, second semiconductor element 313, and third semiconductor element 317. Although FIG. 3B illustrates that base chip 304 can be bonded to two further semiconductor elements 313 and 317, it should be appreciated that base chip 304 can be bonded to more than two semiconductor elements. Similarly, it should be appreciated that although only three testing paths 300 are illustrated, self testing core 302 can test some or all of the functionality of any semiconductor element bonded to base wafer 304. As a non-limiting example, tens or hundreds of semiconductor devices can be bonded to a base wafer 304 and tested by a self-testing core 302 embedded in the base wafer 304.

Figure 3C:
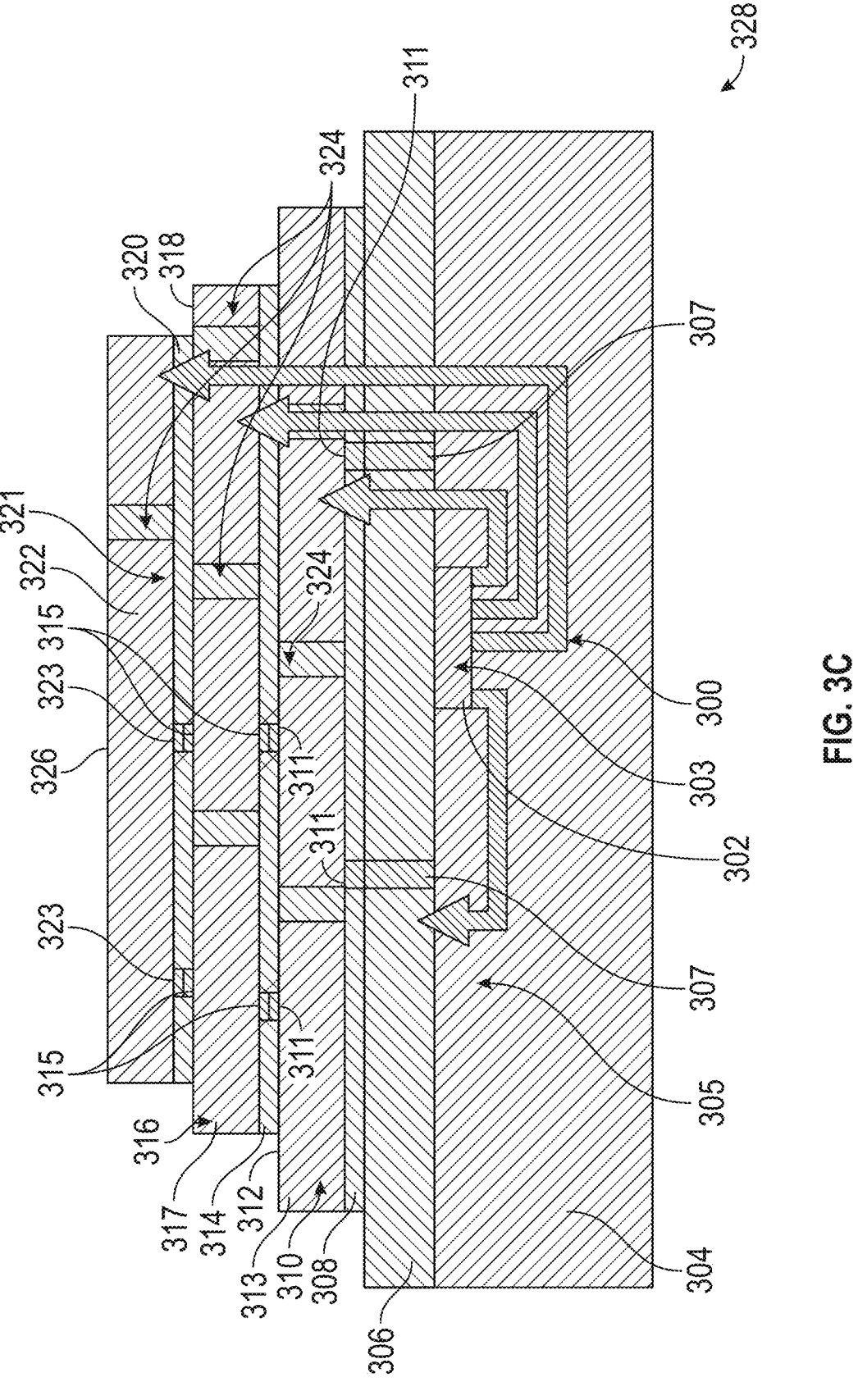
FIG. 3C is a schematic side sectional view of a testing core embedded in a chip bonded to a plurality of stacked semiconductor elements.

FIG. 3C is a schematic side sectional view of a testing core 302 patterned in a base chip 304 which can be bonded to other semiconductor elements. In some embodiments, self testing core 302 can include testing circuitry 303. In some embodiments, self testing core 302 can be patterned in the base chip 304. Base chip 304 can include a device containing active circuitry 305 (e.g., circuitry including at least one integrated circuit patterned in a portion of a base chip 304) and a substrate bonding surface (e.g., a bonding layer which can be a dielectric layer 306) having a plurality of conductive contacts 307 at least partially embedded in the dielectric layer 306. In some embodiments, active circuitry 305 can be one or both of a logic and/or memory circuitry. In some embodiments, a second semiconductor device 313 can include an active circuitry 310 (e.g., circuitry including at least one integrated circuit, which can be one or both a logic and/or memory circuitry) patterned in a portion of the second semiconductor device 313, a second device front side bonding layer 308 and a second device backside layer 312 which can be dielectric layers 308 and 312, and a plurality of conductive contacts 311 at least partially embedded in dielectric layers 308 and 312. In some embodiments, second semiconductor device 310 can include one or more through vias 324 which electrically connect the second device front side bonding layer 308 to the second device back side bonding layer 312. Although FIG. 3C schematically illustrates second device back side bonding layer 312 and second front side device bonding layer 308 as single layers, it should be appreciated that layers 308 and 312 can include multiple layers or sub-layers. In some embodiments, the base chip bonding layer 306 can be directly bonded to the second device front side bonding layer 308. In a hybrid bonding configuration, non-conductive dielectric layers 306 and 308 can be directly bonded without an adhesive and opposing contacts 311 and 307 can be also directly bonded without an adhesive. Although FIGS. 3A-3C schematically illustrate base chip 304, it should be appreciated that base chip 304 can be a chip, a wafer, an interposer, and/or a semiconductor element.

In some embodiments a third semiconductor device 317 can include an active circuitry 316 (e.g., circuitry including at least one integrated circuit) patterned in a portion of the third semiconductor device 317 and a third device back side bonding layer 318 and a third device front side bonding layer 314 which can be dielectric layers 314 and 318, and a plurality of conductive contacts 315 at least partially embedded in the dielectric layers 314 and 318 can be directly bonded to the second device back side bonding layer 312. In some embodiments, active circuitry 316 can be one or both a logic and/or memory circuitry. In a hybrid bonding configuration, non-conductive dielectric layers 312 and 314 can be directly bonded without and adhesive and opposing contacts 311 and 315 can be directly bonded without an adhesive. In some embodiments, one or more vias 324 can electrically connect the third device front side bonding layer 314 to the third device back side bonding layer 318. Although FIG. 3C schematically illustrates third device back side bonding layers 318 and third device front side bonding layer 314 as single layers, it should be appreciated that layers 314 and 318 can include multiple layers or sub-layers.

In some embodiments a fourth semiconductor device 322 can include an active circuitry 321 (e.g., circuitry including at least one integrated circuit) patterned in a portion of the fourth semiconductor device 322, a fourth device back side bonding layer 326 and a fourth device front side bonding layer 320, which can be a dielectric layers 320 and 326, and a plurality of conductive contacts 323 at least partially embedded in the dielectric layers 320 and 326 which can be directly bonded to the third device back side bonding layer 318. In some embodiments, active circuitry 321 can be one or both a logic and/or memory circuitry. In a hybrid bonding configuration, non-conductive dielectric layers 320 and 318 can be directly bonded without and adhesive and opposing contacts 315 and 323 can be directly bonded without an adhesive. In some embodiments, one or more vias 324 can electrically connect the fourth device front side bonding layer 320 to the fourth device back side bonding layer 326. Although FIG. 3C schematically illustrates fourth device back side bonding layer 326 and fourth front side device bonding layer 320 as a single layer, it should be appreciated that layers 320 and 326 can include multiple layers or sub-layers. In some embodiments, self testing core 302 can test some and/or all of the functionality of base chip 304, second semiconductor device 310, third semiconductor device 316, and/or fourth semiconductor device 322, in a similar manner as described in FIGS. 1A-2B. Testing paths 300 illustrate that self testing core 302 can be in electrical communication with base chip 304, second semiconductor element 310, third semiconductor element 316 and/or fourth semiconductor element 322. Although FIG. 3B illustrates a bonded structure 328 of four elements: base chip 304, second semiconductor element 313, third semiconductor element 316, and fourth semiconductor element 322, it should be appreciated that a bonded structure 328, according to some embodiments, can include tens and/or hundreds of elements. Similarly, it should be appreciated that although only four testing paths 300 are illustrated in FIG. 3C, self testing core 302 can test some or all of the functionality of any semiconductor element in the bonded structure 328. As a non-limiting example, tens and/or hundreds of semiconductor devices can be bonded to a base wafer 304 and tested by a self-testing core 302.

Figure 4:
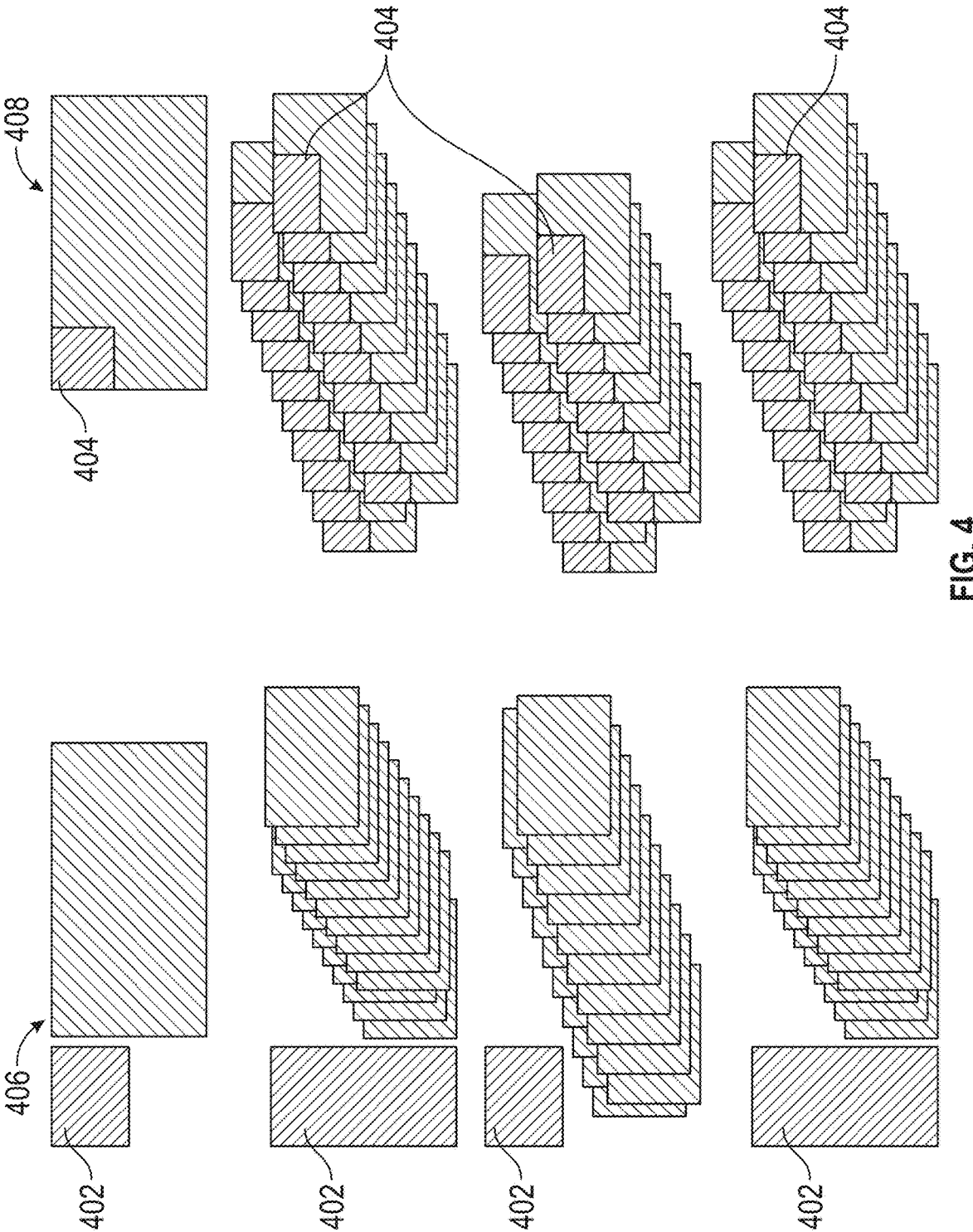
FIG. 4 is a schematic illustration of directly bonded testing core configurations in comparison with built in self test configurations formed in the semiconductor device die, according to different embodiments.

FIG. 4 is a schematic illustration of testing core configurations in comparison with built in self test configurations, according to different embodiments. In FIG. 4, the left column 406 illustrates different embodiments of chip and chip stacks using a self testing core 402 (also mentioned herein as "self testing chip") that can be directly bonded to a semiconductor chip with active circuitry, which can be one or both a logic and/or memory circuitry, to be tested, according to the various embodiments disclosed herein. The right column 408 illustrates the conventional version of similar chip sets using a built in self test circuits 404 patterned in the semiconductor chip. A self testing core can be fabricated in a more cost effective node than traditional built in self tests. As illustrated in FIG. 4, even though the node of the self testing core, 20 nm, can be of a lower resolution than the than the resolution of an equivalent built in self test, 7 nm, the cost of the 20 nm node can be significantly lower (e.g., 10% lower, 20% lower, 30% lower, etc.) than the built in self test. The cost of the 20 nm node can be lower because the lower resolution 20 nm node is cheaper to produce than the high resolution 7 nm node, and the 20 nm, because it can be directly bonded to the semiconductor element, does not require any of the footprint of the semiconductor element. Moreover, a self testing core or chip can scan, test, and/or verify a larger area than traditional built in self tests because the self testing core or chip can scan and/or test many chips or even the entire system. Moreover, some operations of built in self testing can utilize similar "base" codes, which can allow for the consolidations of test areas and/or reduction of overall silicon area that is dedicated to the test node. For example, FIG. 4 illustrates that in traditional built in self testing systems, each die has a part of the wafer footprint that is dedicated to a built in self test 404. However, self testing chips 402 can allow for a (possibly larger) chip to be used to test multiple chips. Because the one self testing chip 402 can test multiple chips, self testing chip 402 can be more effective and/or reduce overall costs. Moreover because self testing chips 402 can not be within a device's footprint, self testing chips 402 can encompass more algorithms and greater testing capacity than built in self testing circuits 404, which can further reduce the complexity of other chips or devices due to the offboarding of possible testing logics.

In some embodiments, bonding layers may comprise a nonconductive layer (e.g., a dielectric material) with conductive contacts at least partially embedded in the nonconductive layer. In some embodiments, the dielectric layers may comprise inorganic dielectric materials compatible with integrated circuit fabrication. In some embodiments, the dielectric layers may be dielectric materials such as silicon nitride, silicon oxynitride, silicon carbonitride, diamond-like carbon, and/or any other suitable dielectric material. The conductive contacts can comprise any suitable metal, such as copper.

In some embodiments, the semiconductor devices may comprise an integrated circuit device with active circuitry (e.g., circuitry with one or more transistors). In some embodiments, the semiconductor devices may comprise a system on a chip (SoC) device. In some embodiments, a semiconductor device may comprise a central processing unit, a memory device, a microcontroller, a microprocessor, an application specific integrated circuit, a graphics processing unit or any combination thereof.

In some embodiments, the semiconductor devices may comprise a semiconductor substrate. In some devices the semiconductor substrate may comprise silicon. In some devices, the semiconductor substrate may comprise single crystal silicon or multicrystalline silicon. In some embodiments, the semiconductor devices may comprise through vias. In some embodiments, through vias may comprise a metal structure that extends at least partially through, e.g. completely through, the semiconductor device. In some embodiments, the through via may comprise a conductive material. In some embodiments, through vias may comprise copper, or any other suitable conductive material.

In some embodiments, a self testing core may be a self testing chip. In some embodiments a self testing core may comprise a testing chip. In some embodiments, a self testing chip may comprise a testing circuitry. In some embodiments a testing circuitry may comprise an integrated circuit. In some embodiments, the testing circuitry may be integrated into a base device. In some embodiments, a self testing core may be configured to test some or all of the functionality of a semiconductor device. In some embodiments, a self testing core may be configured to test some or all of the functionality of any number of semiconductor devices, e.g., 1, 2, 3, 4, 5, 6, 7, or more semiconductor devices. In some embodiments, a self testing core may be configured to test a plurality of devices sequentially and/or simultaneously.

In some embodiments, a self testing core may be bonded to a semiconductor element without an adhesive. In some embodiments, a self testing core bonded to a semiconductor element may be in electrical communication with one or more integrated circuits within the semiconductor element. In some embodiments, the self testing core may be able to verify or test the functionality of the semiconductor element and/or the integrated circuit or circuits therein.

In some embodiments, a self testing core may comprise a chip with integrated circuitry. In some embodiments, a self testing core may comprise a chip or an electrical element or a part of a device with a routing circuitry. In some embodiments, a routing circuitry may comprise an electrical input or electrical output. In some embodiments, the routing circuitry may be connected to or in electrical or other communication with the integrated circuitry. In some embodiments, a self testing core may comprise electrical contacts or contact pads. In some embodiments, the electrical contacts or contact pads may be in electrical communication with on or both of the testing circuitry or the integrated circuitry.

In some embodiments, a self testing core may test some or all of the functionality of a semiconductor device. In some embodiments, a self testing core is configured to provide an output signal. In some embodiments, the output signal correlates to the functionality of the semiconductor device. In some embodiments, the functionality of the semiconductor device is indicative of the device's suitability for a given purpose of the device's quality. In some embodiments, a device's quality corresponds to whether or not the device functions as designed.

In some embodiments, a semiconductor element comprises an integrated circuit within a substrate. In some embodiments, an integrated circuit is connected to a surface of the substrate by an input or output structure. In some embodiments, the input or output structure is a through via. In some embodiments, the input or output structure is in electrical communication with the integrated circuit. In some embodiments, a semiconductor element comprises a routing circuitry in communication with or connected to an integrated circuitry. In some embodiments, the input or output structure may comprise a routing circuitry. In some embodiments, the semiconductor device may comprise electrical contacts, e.g. contact pads. In some embodiments, the electrical contact pads or contacts may be electrically connected to or in communication with one or both of an integrated circuitry or a routing circuitry.

Examples of Direct Bonding Methods and Directly Bonded Structures

Various embodiments disclosed herein relate to directly bonded structures in which two or more elements can be directly bonded to one another without an intervening adhesive. FIGS. 5A and 5B schematically illustrate a process for forming a directly hybrid bonded structure without an intervening adhesive according to some embodiments. In FIGS. 5A and 5B, a bonded structure 500 comprises two elements 502 and 504 that can be directly bonded to one another at a bond interface 518 without an intervening adhesive. Two or more microelectronic elements 502 and 504 (such as semiconductor elements, including, for example, integrated device dies, wafers, passive devices, individual active devices such as power switches, etc.) may be stacked on or bonded to one another to form the bonded structure 500. Conductive features 506a (e.g., contact pads, exposed ends of vias (e.g., TSVs), or a through substrate electrodes) of a first element 502 may be electrically connected to corresponding conductive features 506b of a second element 504. Any suitable number of elements can be stacked in the bonded structure 500. For example, a third element (not shown) can be stacked on the second element 504, a fourth element (not shown) can be stacked on the third element, and so forth. Additionally or alternatively, one or more additional elements (not shown) can be stacked laterally adjacent one another along the first element 502. In some embodiments, the laterally stacked additional element may be smaller than the second element. In some embodiments, the laterally stacked additional element may be two times smaller than the second element.

In some embodiments, the elements 502 and 504 are directly bonded to one another without an adhesive. In various embodiments, a non-conductive field region that includes a non-conductive or dielectric material can serve as a first bonding layer 508a of the first element 502 which can be directly bonded to a corresponding non-conductive field region that includes a non-conductive or dielectric material serving as a second bonding layer 508b of the second element 504 without an adhesive. The non-conductive bonding layers 508a and 508b can be disposed on respective front sides 514a and 514b of device portions 510a and 510b, such as a semiconductor (e.g., silicon) portion of the elements 502, 503. Active devices and/or circuitry can be patterned and/or otherwise disposed in or on the device portions 510a and 510b. Active devices and/or circuitry can be disposed at or near the front sides 514a and 514b of the device portions 510a and 510b, and/or at or near opposite backsides 516a and 516b of the device portions 510a and 510b. Bonding layers can be provided on front sides and/or back sides of the elements. The non-conductive material can be referred to as a non-conductive bonding region or bonding layer 508a of the first element 502. In some embodiments, the non-conductive bonding layer 508a of the first element 502 can be directly bonded to the corresponding non-conductive bonding layer 508b of the second element 504 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 508a and/or 508b can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials do not comprise polymer materials, such as epoxy, resin or molding materials.

In some embodiments, the device portions 510a and 510b can have a significantly different coefficients of thermal expansion (CTEs) defining a heterogenous structure. The CTE difference between the device portions 510a and 510b, and particularly between bulk semiconductor, typically single crystal portions of the device portions 510a, 510b, can be greater than 5 ppm or greater than 10 ppm. For example, the CTE difference between the device portions 510a and 510b can be in a range of 5 ppm to 100 ppm, 5 ppm to 40 ppm, 10 ppm to 100 ppm, or 10 ppm to 40 ppm. In some embodiments, one of the device portions 510a and 510b can comprise optoelectronic single crystal materials, including perovskite materials, that are useful for optical piezoelectric or pyroelectric applications, and the other of the device portions 510a, 510b comprises a more conventional substrate material. For example, one of the device portions 510a, 510b comprises lithium tantalate ($LiTaO_3$) or lithium niobate ($LiNbO_3$), and the other one of the device portions 510a, 510b comprises silicon (Si), quartz, fused silica glass, sapphire, or a glass. In other embodiments, one of the device portions 510a and 510b comprises a III-V single semiconductor material, such as gallium arsenide (GaAs) or gallium nitride (GaN), and the other one of the device portions 510a and 510b can comprise a non-III-V semiconductor material, such as silicon (Si), or can comprise other materials with similar CTE, such as quartz, fused silica glass, sapphire, or a glass.

In various embodiments, direct hybrid bonds can be formed without an intervening adhesive. For example, non-conductive bonding surfaces 512a and 512b can be polished to a high degree of smoothness. The nonconductive bonding surfaces 512a and 512b can be polished using, for example, chemical mechanical polishing (CMP). The roughness of the polished bonding surfaces 512a and 512b can be less than 30 Å rms. For example, the roughness of the bonding surfaces 512a and 512b can be in a range of about 0.1 Å rms to 15 Å rms, 0.5 Å rms to 10 Å rms, or 1 Å rms to 5 Å rms. The bonding surfaces 512a and 512b can be cleaned and exposed to a plasma and/or etchants to activate the surfaces 512a and 512b. In some embodiments, the surfaces 512a and 512b can be terminated with a species after activation or during activation (e.g., during the plasma and/or etch processes). Without being limited by theory, in some embodiments, the activation process can be performed to break chemical bonds at the bonding surfaces 512a and 512b, and the termination process can provide additional chemical species at the bonding surfaces 512a and 512b that improves the bonding energy during direct bonding. In some embodiments, the activation and termination are provided in the same step, e.g., a plasma to activate and terminate the surfaces 512a and 512b. In other embodiments, the bonding surfaces 512a and 512b can be terminated in a separate treatment to provide the additional species for direct bonding. In various embodiments, the terminating species can comprise nitrogen. For example, in some embodiments, the bonding surface(s) 512a, 512b can be exposed to a nitrogen-containing plasma. Further, in some embodiments, the bonding surfaces 512a and 512b can be exposed to fluorine. For example, there may be one or multiple fluorine peaks at or near a bond interface 518 between the first and second elements 502, 504. Thus, in the directly bonded structure 500, the bond interface 518 between two non-conductive materials (e.g., the bonding layers 508a and 508b) can comprise a very smooth interface with higher nitrogen content and/or fluorine peaks at the bond interface 518. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces 512a and 512b can be slightly rougher (e.g., about 1 Å rms to 30 Å rms, 3 Å rms to 20 Å rms, or possibly rougher) after an activation process.

In various embodiments, conductive features 506a of the first element 502 can also be directly bonded to corresponding conductive features 506b of the second element 504. For example, a direct hybrid bonding technique can be used to provide conductor-to-conductor direct bonds along the bond interface 518 that includes covalently direct bonded non-conductive-to-non-conductive (e.g., dielectric-to-dielectric) surfaces, prepared as described above. In various embodiments, the conductor-to-conductor (e.g., conductive feature 506a to conductive feature 506b) direct bonds and the dielectric-to-dielectric hybrid bonds can be formed using the direct bonding techniques disclosed at least in U.S. Pat. Nos. 9,716,033 and 9,552,988, the entire contents of each of which are incorporated by reference herein in their entirety and for all purposes. In direct hybrid bonding embodiments described herein, conductive features are provided within non-conductive bonding layers, and both conductive and nonconductive features are prepared for direct bonding, such as by the planarization, activation and/or termination treatments described above. Thus, the bonding surface prepared for direct bonding includes both conductive and non-conductive features.

For example, non-conductive (e.g., dielectric) bonding surfaces 512a, 512b (for example, inorganic dielectric surfaces) can be prepared and directly bonded to one another without an intervening adhesive as explained above. Conductive contact features (e.g., conductive features 506a and 506b which may be at least partially surrounded by non-conductive dielectric field regions within the bonding layers 508a, 508b) may also directly bond to one another without an intervening adhesive. In various embodiments, the conductive features 506a, 506b can comprise discrete pads or traces at least partially embedded in the non-conductive field regions. In some embodiments, the conductive contact features can comprise exposed contact surfaces of through substrate vias (e.g., through silicon vias (TSVs)). In some embodiments, the respective conductive features 506a and 506b can be recessed below exterior (e.g., upper) surfaces (non-conductive bonding surfaces 512a and 512b) of the dielectric field region or non-conductive bonding layers 508a and 508b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 508a and 508b can be directly bonded to one another without an adhesive at room temperature in some embodiments and, subsequently, the bonded structure 500 can be annealed. Upon annealing, the conductive features 506a and 506b can expand and contact one another to form a metal-to-metal direct bond. Beneficially, the use of Direct Bond Interconnect, or DBI®, techniques commercially available from Adeia of San Jose, CA, can enable high density of conductive features 506a and 506b to be connected across the direct bond interface 518 (e.g., small or fine pitches for regular arrays). In some embodiments, the pitch of the conductive features 506a and 506b, such as conductive traces embedded in the bonding surface of one of the bonded elements, may be less than 100 microns or less than 10 microns or even less than 2 microns. For some applications, the ratio of the pitch of the conductive features 506a and 506b to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features 506a and 506b and/or traces can comprise copper or copper alloys, although other metals may be suitable. For example, the conductive features disclosed herein, such as the conductive features 506a and 506b, can comprise fine-grain metal (e.g., a fine-grain copper).

Thus, in direct bonding processes, a first element 502 can be directly bonded to a second element 504 without an intervening adhesive. In some arrangements, the first element 502 can comprise a singulated element, such as a singulated integrated device die. In other arrangements, the first element 502 can comprise a carrier or substrate (e.g., a wafer) that includes a plurality (e.g., tens, hundreds, or more) of device regions that, when singulated, form a plurality of integrated device dies. Similarly, the second element 504 can comprise a singulated element, such as a singulated integrated device die. In other arrangements, the second element 504 can comprise a carrier or substrate (e.g., a wafer). The embodiments disclosed herein can accordingly apply to wafer-to-wafer (W2 W), die-to-die (D2D), or die-to-wafer (D2 W) bonding processes. In wafer-to-wafer (W2 W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 502 and 504 can be directly bonded to one another without an adhesive, which is different from a deposition process and results in a structurally different interface compared to a deposition. In one application, a width of the first element 502 in the bonded structure is similar to a width of the second element 504. In some other embodiments, a width of the first element 502 in the bonded structure 500 is different from a width of the second element 504. Similarly, the width or area of the larger element in the bonded structure may be at least 10% larger than the width or area of the smaller element. The first and second elements 502 and 504 can accordingly comprise non-deposited elements. Further, directly bonded structures 500, unlike deposited layers, can include a defect region along the bond interface 518 in which nanometer-scale voids (nanovoids) are present. The nanovoids may be formed due to activation of the bonding surfaces 512a and 512b (e.g., exposure to a plasma). As explained above, the bond interface 518 can include concentration of materials from the activation and/or last chemical treatment processes. For example, in embodiments that utilize a nitrogen plasma for activation, a nitrogen peak can be formed at the bond interface 518. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In embodiments that utilize an oxygen plasma for activation, an oxygen peak can be formed at the bond interface 518. In some embodiments, the bond interface 518 can comprise silicon oxynitride, silicon oxycarbonitride, or silicon carbonitride. As explained herein, the direct bond can comprise a covalent bond, which is stronger than van Der Waals bonds.

The bonding layers 508a and 508b can also comprise polished surfaces that are planarized to a high degree of smoothness.

In various embodiments, the metal-to-metal bonds between the conductive features 506a and 506b can be joined such that metal grains grow into each other across the bond interface 518. In some embodiments, the metal is or includes copper, which can have grains oriented along the 511 crystal plane for improved copper diffusion across the bond interface 518. In some embodiments, the conductive features 506a and 506b may include nanotwinned copper grain structure, which can aid in merging the conductive features during anneal. The bond interface 518 can extend substantially entirely to at least a portion of the bonded conductive features 506a and 506b, such that there is substantially no gap between the non-conductive bonding layers 508a and 508b at or near the bonded conductive features 506a and 506b. In some embodiments, a barrier layer may be provided under and/or laterally surrounding the conductive features 506a and 506b (e.g., which may include copper). In other embodiments, however, there may be no barrier layer under the conductive features 506a and 506b, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 506a and 506b, and/or small pad sizes. For example, in various embodiments, the pitch p (i.e., the distance from edge-to-edge or center-to-center, as shown in FIG. 1A) between adjacent conductive features 506a (or 506b) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 508a, 508b can be directly bonded to one another without an adhesive and, subsequently, the bonded structure 500 can be annealed. Upon annealing, the conductive features 506a, 506b can expand and contact one another to form a metal-to-metal direct bond. In some embodiments, the materials of the conductive features 506a, 506b can interdiffuse during the annealing process.

Terminology

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

Several illustrative examples of testing elements for bonded structures and related systems and methods have been disclosed. Although this disclosure has been described in terms of certain illustrative examples and uses, other examples and other uses, including examples and uses which do not provide all of the features and advantages set forth herein, are also within the scope of this disclosure. Components, elements, features, acts, or steps may be arranged or performed differently than described and components, elements, features, acts, or steps may be combined, merged, added, or left out in various examples. All possible combinations and subcombinations of elements and components described herein are intended to be included in this disclosure. No single feature or group of features is necessary or indispensable.

Certain features that are described in this disclosure in the context of separate implementations may also be implemented in combination in a single implementation. Conversely, various features that are described in the context of a single implementation also may be implemented in multiple implementations separately or in any suitable subcombination. Moreover, although features may be described above as acting in certain combinations, one or more features from a claimed combination may in some cases be excised from the combination, and the combination may be claimed as a subcombination or variation of a subcombination.

Further, while illustrative examples have been described, any examples having equivalent elements, modifications, omissions, and/or combinations are also within the scope of this disclosure. Moreover, although certain aspects, advantages, and novel features are described herein, not necessarily all such advantages may be achieved in accordance with any particular example. For example, some examples within the scope of this disclosure achieve one advantage, or a group of advantages, as taught herein without necessarily achieving other advantages taught or suggested herein. Further, some examples may achieve different advantages than those taught or suggested herein.

Some examples have been described in connection with the accompanying drawings. The figures may or may not be drawn and/or shown to scale, but such scale should not be limiting, since dimensions and proportions other than what are shown are contemplated and are within the scope of the disclosed invention. Distances, angles, etc. are merely illustrative and do not necessarily bear an exact relationship to actual dimensions and layout of the devices illustrated. Components may be added, removed, and/or rearranged. Further, the disclosure herein of any particular feature, aspect, method, property, characteristic, quality, attribute, element, or the like in connection with various examples may be used in all other examples set forth herein. Additionally, any methods described herein may be practiced using any device suitable for performing the recited steps.

For purposes of summarizing the disclosure, certain aspects, advantages and features of the inventions have been described herein. Not all, or any such advantages are necessarily achieved in accordance with any particular example of the inventions disclosed herein. No aspects of this disclosure are essential or indispensable. In many examples, the devices, systems, and methods may be configured differently than illustrated in the figures. or description herein. For example, various functionalities provided by the illustrated modules may be combined, rearranged, added, or deleted. In some implementations, additional or different processors or modules may perform some or all of the functionalities described with reference to the examples described and illustrated in the figures. Many implementation variations are possible. Any of the features, structures, steps, or processes disclosed in this specification may be included in any example.

What is claimed is:

1. A bonded structure comprising;
   a first semiconductor element comprising a first active circuitry; and
   a testing element comprising a testing circuitry, the testing element directly bonded to the first semiconductor element without an adhesive along a bonding interface;
   wherein the testing circuitry is configured to test functionality of at least a portion of the first active circuitry of the first semiconductor element during operation of the bonded structure by transmitting one or more signals to the first active circuitry and receiving a return signal emitted by the tested active circuitry, wherein the one or more signals probe the one or more portions of the first active circuitry; and
   wherein the testing circuitry processes the received return signal during operation of the bonded structure to determine whether the tested active circuitry of the first semiconductor element is functional or non-functional.

2. The bonded structure of claim 1, wherein the testing element further comprises a memory configured to store a result of the test.

3. The bonded structure of claim 1, wherein the testing element is smaller than the first semiconductor element.

4. The bonded structure of claim 1, wherein a first nonconductive bonding layer of the first semiconductor element is directly bonded to a second nonconductive bonding layer of the testing element without an intervening adhesive; and wherein a first contact feature of the first semiconductor element is directly bonded to a second contact feature of the testing element without an intervening adhesive.

5. The bonded structure of claim 1, wherein the testing element further comprises a plurality of signal contact pads.

6. The bonded structure of claim 5, wherein a majority of the plurality of signal contact pads are configured to test at least the portion of the first active circuitry of the first semiconductor element.

7. A bonded structure comprising;

a first semiconductor element comprising a testing circuitry; and a second semiconductor element directly bonded to the first semiconductor element without an adhesive along a bonding interface, the second semiconductor element comprising a first active circuitry;

wherein the testing circuitry is configured to test functionality of at least a portion of the first active circuitry of the second semiconductor element.

8. The bonded structure of claim 7, wherein the testing circuitry is further configured to store a result of the functionality of at least the portion of the first active circuitry.

9. The bonded structure of claim 7, wherein a first nonconductive bonding layer of the first semiconductor element is directly bonded to a second nonconductive layer of the second semiconductor element without an intervening adhesive; and wherein a first contact feature of the first semiconductor element is directly bonded to a second contact feature of the second semiconductor element without an intervening adhesive.

10. The bonded structure of claim 7, further comprising a third semiconductor element comprising a second active circuitry, the third semiconductor element directly bonded to the second semiconductor element, the testing circuitry configured to test functionality of at least a portion of the second active circuitry.

11. The bonded structure of claim 10, further comprising a fourth semiconductor element comprising a third active circuitry, the fourth semiconductor element directly bonded to the third semiconductor element.

12. The bonded structure of claim 11, wherein the first semiconductor element further comprises a fourth active circuitry.

13. The bonded structure of claim 12, wherein the testing circuitry of the first semiconductor element is configured to test at least a portion of the functionality of the first active circuitry, the second active circuitry, the third active circuitry, and/or the fourth active circuitry.

14. The bonded structure of claim 7, further comprising a third semiconductor element comprising a second active circuitry, the third semiconductor element directly bonded to the first semiconductor element, wherein the testing circuitry is configured to test functionality of at least a portion of the second active circuitry.

15. The bonded structure of claim 7, wherein the first semiconductor element comprises a testing chip.

16. The bonded structure of claim 15, wherein the testing chip is configured to only test the active circuitry of one or more other semiconductor elements and is devoid of other active circuitry.

17. The bonded structure of claim 16, further comprising a third semiconductor element comprising a second active circuitry and a second bonding layer bonded to the second semiconductor element without an adhesive, wherein the testing circuitry is configured to test functionality of at least a portion of the second active circuitry.

18. The bonded structure of claim 17, further comprising a fourth semiconductor element comprising a third active circuitry and a third bonding layer bonded to the second semiconductor element without an adhesive, wherein the testing circuitry is configured to test functionality of at least a portion of the third active circuitry.

19. The bonded structure of claim 18, wherein the testing circuitry is configured to transmit one or more signals to the first active circuitry.

20. The bonded structure of claim 19, wherein the one or more signals probe one or more portions of the first active circuitry.

21. The bonded structure of claim 20, wherein:

the first active circuitry emits a return signal and the return signal is conveyed from the first active circuitry to the testing circuitry; and the testing circuitry is configured to analyze the return signal and transmit an indication signal to a first device.

22. A bonded structure comprising:

a first semiconductor element comprising a first active circuitry;

a first nonconductive bonding layer of the first semiconductor element at least partially defining a direct bonding surface of the bonded structure; and one or more traces connected to the first active circuitry and extending at least partially into the first nonconductive bonding layer, wherein the one or more traces is configured to provide electrical communication between the first active circuitry and a testing element, the one or more traces terminating at or below the direct bonding surface.

23. The bonded structure of claim 22, further comprising a first contact feature at least partially embedded within the first nonconductive bonding layer and connected to the one or more traces, the first contact feature configured to directly bond to a corresponding second contact feature of the testing element.

24. The bonded structure of claim 22, further comprising a plurality of contact features at least partially embedded in the first nonconductive bonding layer, wherein the first nonconductive bonding layer and the plurality of contact features cooperate to at least partially define a bonding surface for direct hybrid bonding.

25. The bonded structure of claim 22, wherein the one or more traces are not connected to a contact pad at the direct bonding surface of the bonded structure.

* * * * *